(12) United States Patent
Otsubo

(10) Patent No.: US 12,414,225 B2
(45) Date of Patent: Sep. 9, 2025

(54) CIRCUIT MODULE

(71) Applicant: Murata Manufacturing Co., Ltd., Nagaokakyo (JP)

(72) Inventor: Yoshihito Otsubo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 224 days.

(21) Appl. No.: 18/483,870

(22) Filed: Oct. 10, 2023

(65) Prior Publication Data

US 2024/0138052 A1 Apr. 25, 2024
US 2024/0237188 A9 Jul. 11, 2024

(30) Foreign Application Priority Data

Oct. 19, 2022 (JP) ................... 2022-167403

(51) Int. Cl.
*H05K 1/02* (2006.01)
*H01L 23/367* (2006.01)
(Continued)

(52) U.S. Cl.
CPC ....... *H05K 1/0203* (2013.01); *H01L 23/3675* (2013.01); *H01L 25/105* (2013.01);
(Continued)

(58) Field of Classification Search
CPC ....... H01L 2225/1094; H01L 23/49816; H01L 2924/181; H01L 2225/1058; H01L 2225/1023; H01L 25/105; H01L 23/5385; H01L 23/5383; H01L 23/3121; H01L 23/367; H01L 21/486; H01L 2224/0401; H01L 2225/107; H01L 23/12; H01L 23/3135; H01L 23/36; H01L 23/49894; H01L 2224/1146; H01L 2224/11462; H01L 2224/33505; H01L 2224/32245; H01L 2224/29299; H01L 2224/214;
(Continued)

(56) References Cited

U.S. PATENT DOCUMENTS 11,133,244 B2 * 9/2021 Yeh ..................... H01L 23/5385
2010/0258944 A1 * 10/2010 Uchiyama .......... H01L 23/5384
257/773

(Continued)

FOREIGN PATENT DOCUMENTS

JP 5605222 B2 10/2014

*Primary Examiner* — Michael A Matey
(74) *Attorney, Agent, or Firm* — McDonald Hopkins LLC

(57) ABSTRACT

A first sealing resin is disposed between a first lower main surface and a second upper main surface. An upper circuit board first mounting electrode is disposed on the first lower main surface. A lower circuit board first mounting electrode is disposed on the second upper main surface. A first component is mounted on the lower circuit board first mounting electrode and is disposed in the first sealing resin. A first conductor layer is disposed on an upper circuit board. As viewed in the downward direction, a heat conduction member overlaps the first component, is disposed in a space between the first lower main surface and the second upper main surface, and is coupled to the first conductor layer via a conductor. A part of a heat dissipation member is exposed from the first sealing resin in a direction orthogonal to an up-down axis.

15 Claims, 16 Drawing Sheets

(51) Int. Cl.
  *H01L 25/10* (2006.01)
  *H01L 25/16* (2023.01)
  *H05K 1/14* (2006.01)
  *H05K 1/18* (2006.01)

(52) U.S. Cl.
  CPC ........... *H01L 25/162* (2013.01); *H05K 1/144* (2013.01); *H05K 1/181* (2013.01); *H01L 2225/1094* (2013.01); *H05K 2201/042* (2013.01); *H05K 2201/10015* (2013.01); *H05K 2201/1003* (2013.01); *H05K 2201/10522* (2013.01); *H05K 2201/10545* (2013.01); *H05K 2201/1056* (2013.01)

(58) Field of Classification Search
  CPC ....... H01L 2224/33181; H01L 2224/81; H01L 2224/81191; H01L 2225/06589; H01L 2225/06586; H01L 2225/06548; H01L 2225/06541; H01L 23/49822; H01L 23/3675; H01L 25/162; H05K 1/144; H05K 1/181; H05K 2201/042; H05K 2201/10734; H05K 1/0203; H05K 1/11; H05K 3/46; H05K 1/0243; H05K 1/0298; H05K 1/115; H05K 1/18; H05K 1/141; H05K 1/186; H05K 2201/043; H05K 3/4007; H05K 3/3436; H05K 7/1438; H05K 2201/10015; H05K 2201/1003; H05K 2201/10522; H05K 2201/10545; H05K 2201/1056
  See application file for complete search history.

(56) References Cited

U.S. PATENT DOCUMENTS

| | | | |
|---|---|---|---|
| 2011/0062584 A1 | 3/2011 | Ishihara | |
| 2012/0281379 A1* | 11/2012 | Shimada | H01L 23/49827 361/782 |
| 2013/0063902 A1* | 3/2013 | Yoshida | H05K 1/0209 361/728 |
| 2014/0319668 A1* | 10/2014 | Chen | H01L 23/3677 257/686 |
| 2019/0393166 A1* | 12/2019 | Otsubo | H01L 23/552 |
| 2020/0402897 A1* | 12/2020 | Yeh | H01L 25/0652 |
| 2023/0089258 A1* | 3/2023 | Hoang | H05K 7/142 361/787 |
| 2025/0183190 A1* | 6/2025 | Otsubo | H05K 1/02 |

* cited by examiner

FIG. 11
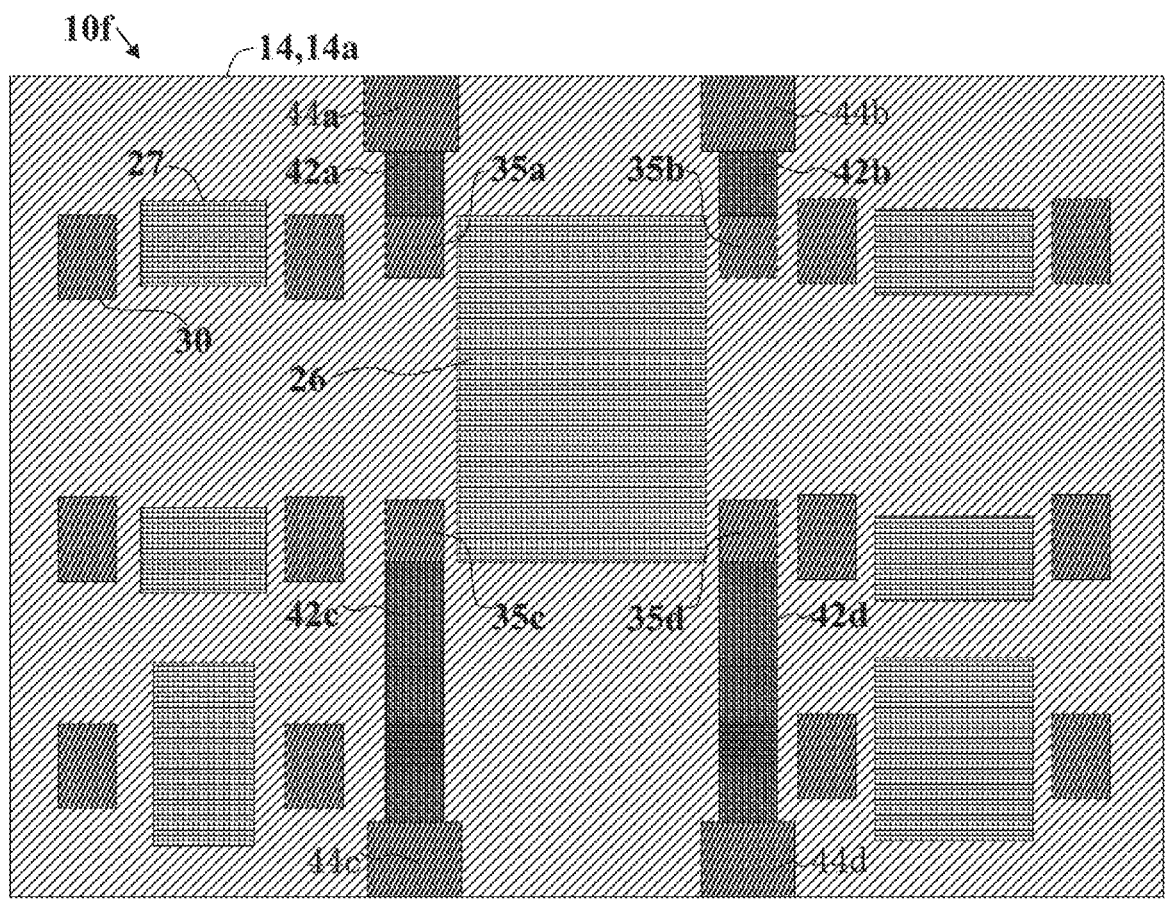
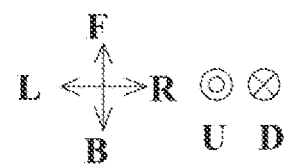

FIG. 13
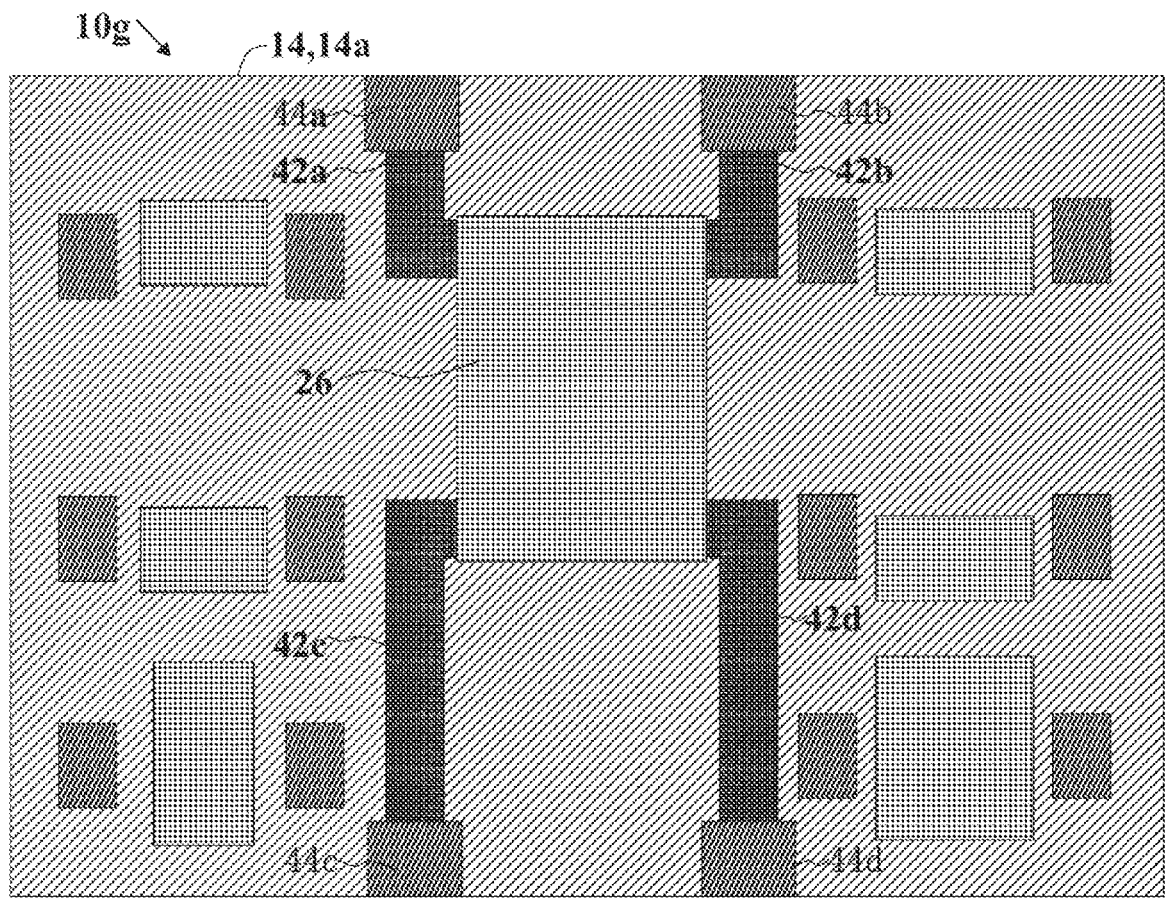
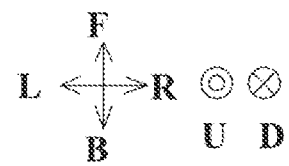

CIRCUIT MODULE

CROSS REFERENCE TO RELATED APPLICATION

This application claims priority from Japanese Patent Application No. 2022-167403 filed on Oct. 19, 2022. The content of this application is incorporated herein by reference in its entirety.

BACKGROUND OF THE DISCLOSURE

1. Field of the Disclosure

The present disclosure relates to an electronic device including an upper circuit board and a lower circuit board.

2. Description of the Related Art

As a disclosure related to a conventional circuit module, for example, a semiconductor device package described in U.S. Pat. No. 11,133,244 is known. This composite substrate includes a first substrate, a second substrate, and a conductive structure. The first substrate is disposed on the second substrate. The conductive structure is a pin extending along an up-down axis. The conductive structure is mounted on a lower main surface of the first substrate and an upper main surface of the second substrate. Due to this, the conductive structure electrically connects the first substrate and the second substrate.

BRIEF SUMMARY OF THE DISCLOSURE

Regarding the semiconductor device package described in U.S. Pat. No. 11,133,244, there is a demand for releasing heat generated by a component disposed between the first substrate and the second substrate to the outside of the semiconductor device package.

A possible benefit of the present disclosure is to provide a circuit module capable of releasing heat generated by a component disposed between an upper circuit board and a lower circuit board to the outside of the circuit module.

A circuit module according to an embodiment of the present disclosure includes: an upper circuit board, a lower circuit board, a first component, a first sealing resin, a heat conduction member, a first conductor layer, and a heat dissipation member, in which the upper circuit board includes an upper circuit board body and one or more upper circuit board first mounting electrodes, the lower circuit board includes a lower circuit board body and one or more lower circuit board first mounting electrodes, and is disposed below the upper circuit board, the upper circuit board body has a first upper main surface and a first lower main surface, the lower circuit board body has a second upper main surface and a second lower main surface, the first sealing resin is disposed between the first lower main surface and the second upper main surface, the one or more upper circuit board first mounting electrodes are disposed on the first lower main surface, the one or more lower circuit board first mounting electrodes are disposed on the second upper main surface, the first component is mounted on the one or more upper circuit board first mounting electrodes or the one or more lower circuit board first mounting electrodes, and is disposed in the first sealing resin, the first conductor layer is disposed on the upper circuit board or the lower circuit board, the heat conduction member overlaps the first component as viewed in a downward direction, is disposed on the first lower main surface, on the second upper main surface, or in a space between the first lower main surface and the second upper main surface, and is directly coupled to the first conductor layer or is coupled to the first conductor layer via a conductor, a part of the heat dissipation member is exposed from the first sealing resin in a direction orthogonal to an up-down axis, and the heat dissipation member is directly coupled to the first conductor layer or is coupled to the first conductor layer via a conductor.

According to the circuit module according to the present disclosure, more components can be mounted between the upper circuit board and the lower circuit board.

BRIEF DESCRIPTION OF THE SEVERAL VIEWS OF THE DRAWINGS

FIG. 4 is a front view of a circuit module 10a;
FIG. 11 is a top view of the circuit module 10f;
FIG. 13 is a top view of the circuit module log.

DETAILED DESCRIPTION OF THE DISCLOSURE

Embodiments

[Structure of Circuit Module 10]

Figure 1:
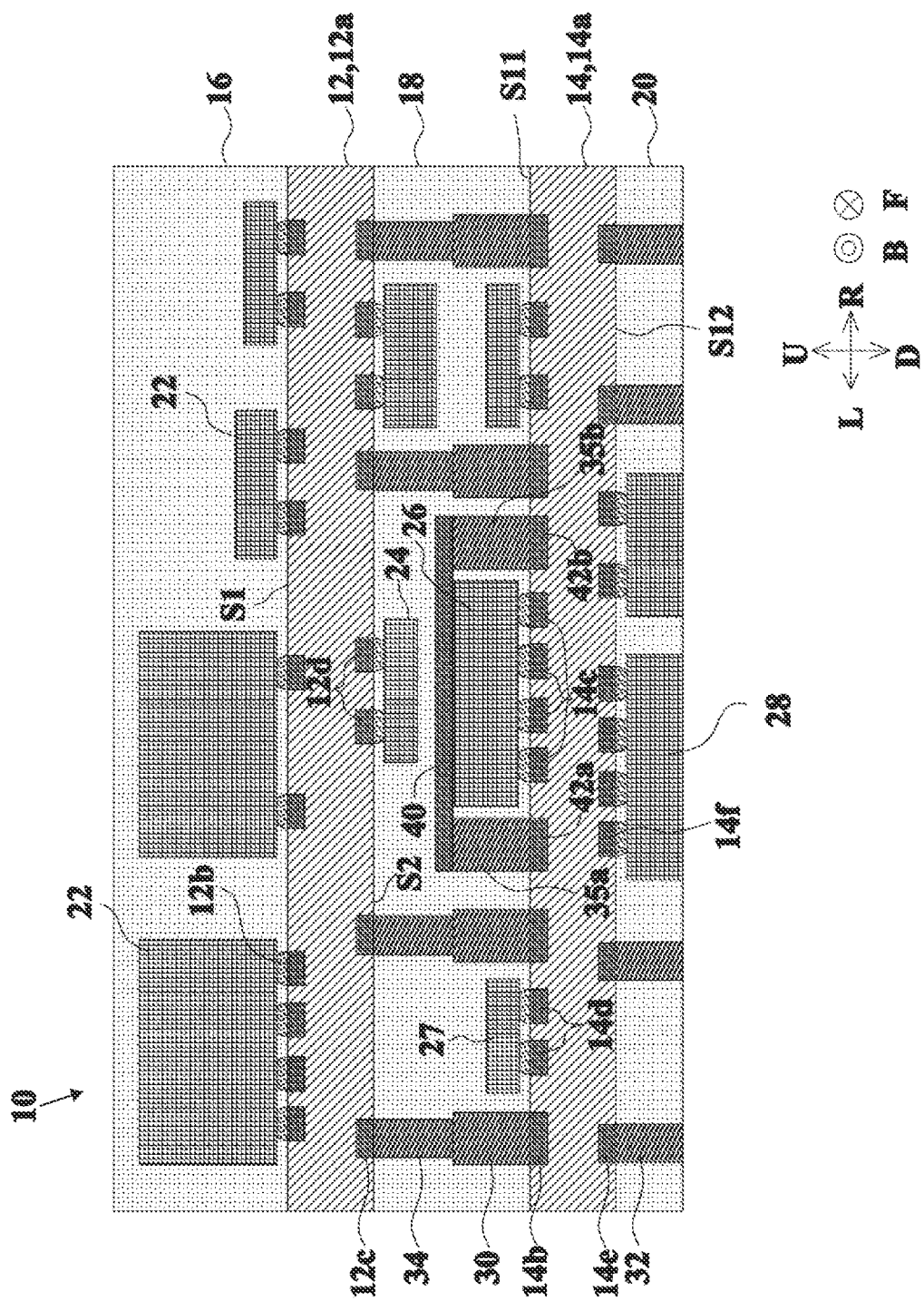
FIG. 1 is a cross-sectional view of a circuit module 10.
Figure 2:
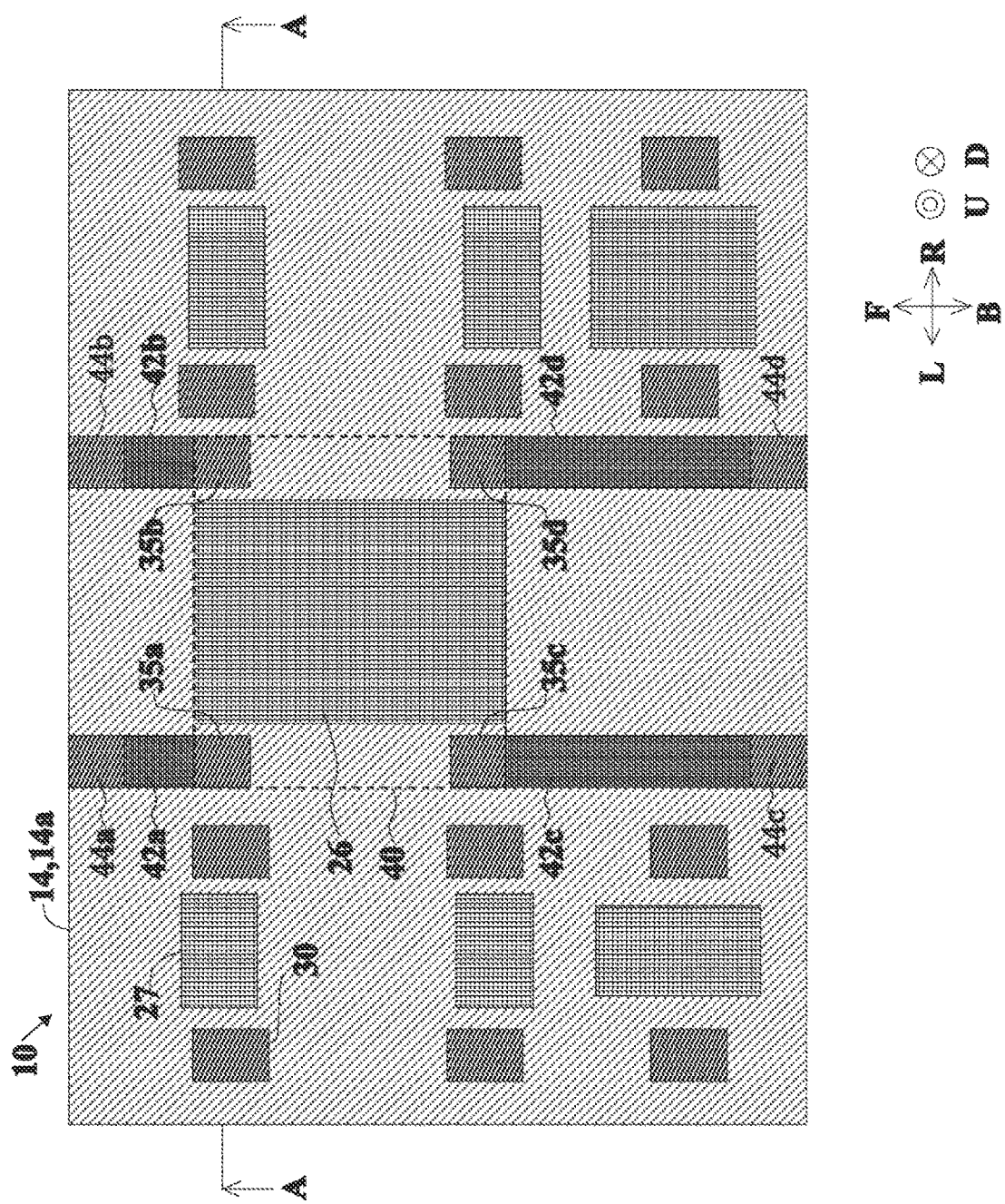
FIG. 2 is a top view of the circuit module 10.
Figure 3:
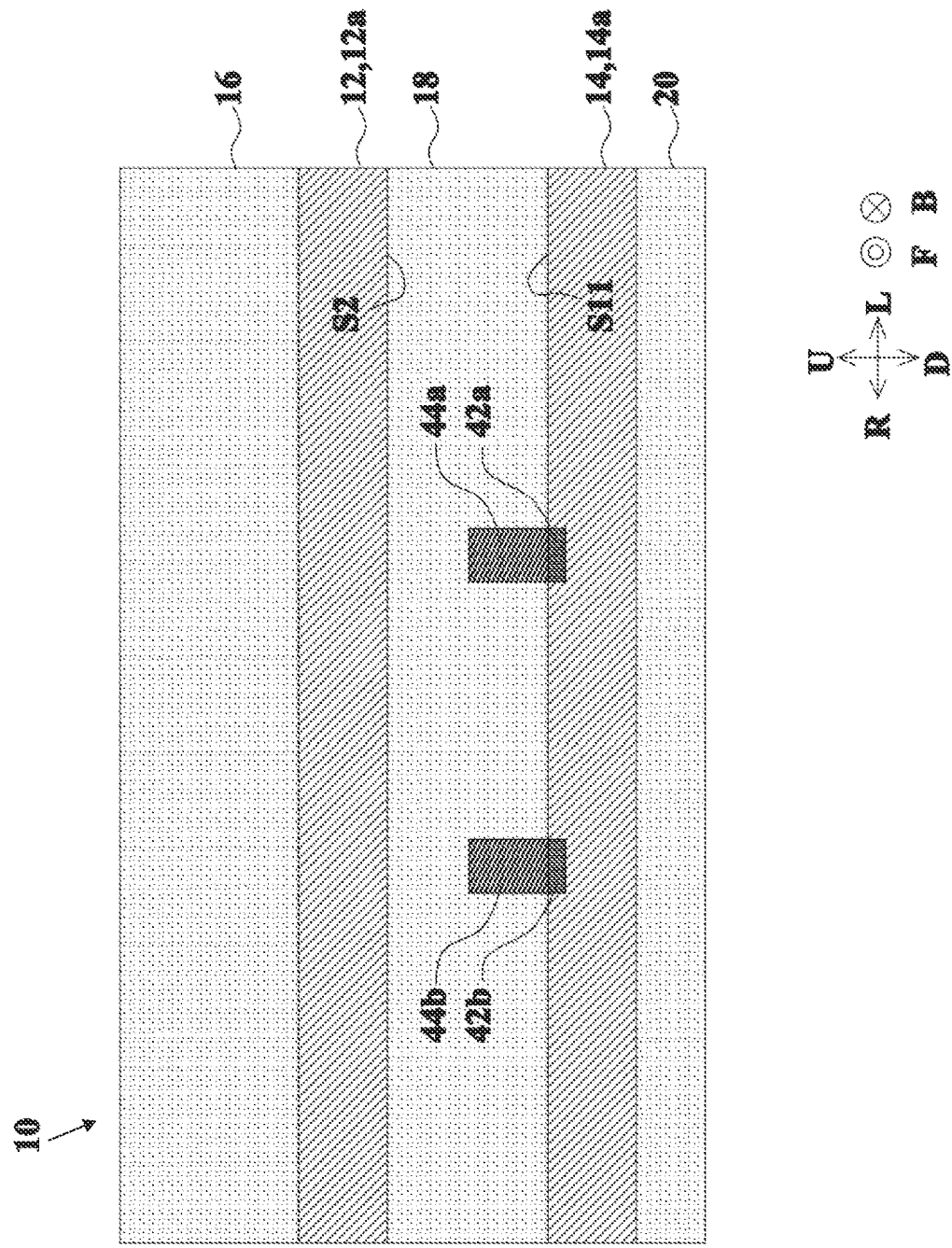
FIG. 3 is a front view of the circuit module 10.

The structure of the circuit module 10 according to a first embodiment of the present disclosure will be described below with reference to the drawings. FIG. 1 is a cross-sectional view of the circuit module 10. FIG. 2 is a top view of the circuit module 10. FIG. 3 is a front view of the circuit module 10.

Hereinafter, as illustrated in FIG. 1, a direction from an upper circuit board 12 toward a lower circuit board 14 is defined as a downward direction of an up-down axis that coincides with an up-down direction. Axes orthogonal to the up-down axis are defined as a front-back axis and a left-right axis. The up-down axis, the front-back axis, and the left-right axis are orthogonal to one another. The front-back axis coincides with an axis extending along an axis perpendicular to the drawing sheet surface of FIG. 1. The left-right axis coincides with the left-right axis of the drawing sheet surface of FIG. 1. However, the up-down axis, the left-right axis, and the front-back axis in the present specification are directions defined for convenience of description, and need not coincide with the up-down axis, the left-right axis, and the front-back axis in use of the circuit module 10. In each drawing, the upward direction and the downward direction may be interchanged, the left direction and the right direction may be interchanged, and the front direction and the back direction may be interchanged.

The circuit module 10 is used for a wireless communication terminal such as a smartphone. The circuit module 10 includes, for example, an integrated circuit (IC) such as a power amplifier (PA) or a low noise amplifier (LNA), and a coil, a capacitor, and the like. The coil, the capacitor, and the like are impedance matching circuit elements for each IC. The circuit module 10 has a cuboid shape. As illustrated in FIG. 1, the circuit module 10 includes the upper circuit board 12, the lower circuit board 14, a sealing resin 16, a first sealing resin 18, a sealing resin 20, a plurality of components 22, a plurality of components 24, a first component 26, a plurality of components 27, a plurality of components 28, a plurality of conductor members 34, a plurality of conductor members 30, a plurality of conductor members 32, conductor members 35a to 35d, a heat conduction member 40, first conductor layers 42a to 42d, and heat dissipation members 44a to 44d.

The upper circuit board 12 includes an upper circuit board body 12a, a plurality of upper circuit board mounting electrodes 12b, a plurality of upper circuit board mounting electrodes 12c, and a plurality of upper circuit board first mounting electrodes 12d. The upper circuit board body 12a has a plate shape having a first upper main surface S1 and a first lower main surface S2. The upper circuit board body 12a has a rectangular shape having two sides along the front-back axis and two sides extending along the left-right axis as viewed in the downward direction. The upper circuit board body 12a has a multilayer structure. An electric circuit not illustrated is provided inside the upper circuit board body 12a. The material of the upper circuit board body 12a is, for example, a glass epoxy or a low temperature co-fired ceramics (LTCC) board, or the like.

As illustrated in FIG. 1, the plurality of upper circuit board mounting electrodes 12b are disposed on the first upper main surface S1. The plurality of upper circuit board mounting electrodes 12c and the plurality of upper circuit board first mounting electrodes 12d are disposed on the first lower main surface S2. The plurality of upper circuit board mounting electrodes 12b, the plurality of upper circuit board mounting electrodes 12c, and the plurality of upper circuit board first mounting electrodes 12d have a rectangular shape or a circular shape as viewed in the downward direction. The plurality of upper circuit board mounting electrodes 12b, the plurality of upper circuit board mounting electrodes 12c, and the plurality of upper circuit board first mounting electrodes 12d have a structure in which, for example, Ni plating and Au plating are applied to the surface of a copper-thick film electrode.

The lower circuit board 14 includes a lower circuit board body 14a, a plurality of lower circuit board mounting electrodes 14b, a plurality of lower circuit board first mounting electrodes 14c, a plurality of lower circuit board mounting electrodes 14d, a plurality of lower circuit board mounting electrodes 14e, and a plurality of lower circuit board mounting electrodes 14f. The lower circuit board body 14a has a plate shape having a second upper main surface S11 and a second lower main surface S12. The lower circuit board body 14a has a rectangular shape having two sides extending along the front-back axis and two sides extending along the left-right axis as viewed in the downward direction. The lower circuit board body 14a has a multilayer structure. An electric circuit not illustrated is provided inside the lower circuit board body 14a. The material of the lower circuit board body 14a is, for example, a glass epoxy or an LTCC board, or the like.

As illustrated in FIG. 1, the plurality of lower circuit board mounting electrodes 14b, the plurality of lower circuit board first mounting electrodes 14c, and the plurality of lower circuit board mounting electrodes 14d are disposed on the second upper main surface S11. The plurality of lower circuit board mounting electrodes 14e and the plurality of lower circuit board mounting electrodes 14f are disposed on the lower main surface of the lower circuit board body 14a. The plurality of lower circuit board mounting electrodes 14b, the plurality of lower circuit board first mounting electrodes 14c, the plurality of lower circuit board mounting electrodes 14d, the plurality of lower circuit board mounting electrodes 14e, and the plurality of lower circuit board mounting electrodes 14f have a rectangular shape or a circular shape as viewed in the downward direction. The plurality of lower circuit board mounting electrodes 14b, the plurality of lower circuit board first mounting electrodes 14c, the plurality of lower circuit board mounting electrodes 14d, the plurality of lower circuit board mounting electrodes 14e, and the plurality of lower circuit board mounting electrodes 14f have a structure in which, for example, Ni plating and Au plating are applied to the surface of a copper thin film.

As illustrated in FIG. 1, the lower circuit board 14 as described above is disposed below the upper circuit board 12. The lower circuit board 14 overlaps the upper circuit board 12 as viewed in the downward direction. As viewed in the downward direction, the entire outer edge of the lower circuit board 14 overlaps the entire outer edge of the upper circuit board 12.

The plurality of conductor members 30 and 34 electrically connect the upper circuit board 12 and the lower circuit board 14. The plurality of conductor members 34 are metal members or conductive members. The plurality of conductor members 34 are, for example, metal pins. The plurality of conductor members 34 have a rod shape extending along the up-down axis. The length of the plurality of conductor members 34 in the up-down direction is longer than the maximum value of the length of the plurality of conductor members 34 in the orthogonal direction orthogonal to the up-down direction. Each of the upper ends of the plurality of conductor members 34 is fixed to the plurality of upper circuit board mounting electrodes 12c by soldering. The material of the plurality of conductor members 34 is, for example, copper.

The plurality of conductor members 30 are metal members or conductive members. The plurality of conductor members 30 re, for example, metal pins. The plurality of conductor members 30 have a rod shape extending along the up-down axis. Therefore, the length of the plurality of conductor members 30 in the up-down direction is longer than the maximum value of the length of the plurality of conductor members 30 in the orthogonal direction orthogonal to the up-down direction. Furthermore, the plurality of conductor members 30 are thicker than the plurality of conductor members 34. That is, the maximum value of the length of the plurality of conductor members 30 in the orthogonal direction orthogonal to the up-down direction is larger than the maximum value of the length of the plurality of conductor members 34 in the orthogonal direction orthogonal to the up-down direction. In the present embodiment, the area of the upper ends of the plurality of conductor members 30 is larger than the area of the lower ends of the plurality of conductor members 34. Each of the lower ends of the plurality of conductor members 30 is fixed to the plurality of lower circuit board mounting electrodes 14b by soldering.

Furthermore, the plurality of conductor members 30 are disposed below the plurality of conductor members 34. The upper ends of the plurality of conductor members 30 are in contact with the lower ends of the plurality of conductor members 34. Due to this, the plurality of conductor members 30 are electrically connected to the plurality of conductor members 34. The material of the plurality of conductor members 30 is, for example, copper. The plurality of conductor members 34 and the plurality of conductor members 30 having the above structure electrically connect the upper circuit board 12 and the lower circuit board 14.

The plurality of conductor members 32 are metal pins. The plurality of conductor members 32 have a rod shape extending along the up-down axis. The length of the plurality of conductor members 32 in the up-down direction is longer than the maximum value of the length of the plurality of conductor members 32 in the orthogonal direction orthogonal to the up-down direction. The plurality of conductor members 32 are connected to the second lower main surface S12. Specifically, each of the upper ends of the plurality of conductor members 32 is fixed to the lower circuit board mounting electrode 14e of the lower circuit board 14 by soldering. The plurality of conductor members 32 come into contact with a mounting electrode of a motherboard when the circuit module 10 is mounted on the motherboard. The material of the plurality of conductor members 32 is, for example, copper.

The plurality of components 22 are mounted on the plurality of upper circuit board mounting electrodes 12b. The plurality of components 22 are electronic components such as chip coils, chip capacitors, and semiconductor integrated circuits.

The plurality of components 24 are mounted on the plurality of upper circuit board first mounting electrodes 12d. The plurality of components 24 are electronic components such as chip coils, chip capacitors, and semiconductor integrated circuits.

The plurality of components 27 are mounted on the plurality of lower circuit board mounting electrodes 14d. The plurality of components 27 are electronic components such as chip coils, chip capacitors, and semiconductor integrated circuits.

The plurality of components 28 are mounted on the plurality of lower circuit board mounting electrodes 14f. The plurality of components 28 are electronic components such as chip coils, chip capacitors, and semiconductor integrated circuits.

The first component 26 is mounted on the plurality of lower circuit board first mounting electrodes 14c. The first component 26 is an electronic component that generates heat during driving. Such an electronic component is, for example, low noise amplification (LNA), power amplification (PA), a switch integrated circuit (IC), or an inductor.

The first conductor layers 42a to 42d are disposed on the lower circuit board. In the present embodiment, the first conductor layers 42a to 42d are disposed on the second upper main surface S11. The first conductor layers 42a to 42d extend along the front-back axis. As viewed in the downward direction, the first conductor layers 42a to 42d have a linear shape. The first conductor layer 42a is disposed at the left front of the first component 26 as viewed in the downward direction. The first conductor layer 42b is disposed on the right front of the first component 26 as viewed in the downward direction. The first conductor layer 42c is disposed on the left back of the first component 26 as viewed in the downward direction. The first conductor layer 42d is disposed on the right back of the first component 26 as viewed in the downward direction.

The heat conduction member 40 is disposed in a space between the first lower main surface S2 and the second upper main surface S11. The heat conduction member 40 is disposed on the first component 26. Due to this, the heat conduction member 40 overlaps the first component 26 as viewed in the downward direction. In the present embodiment, the heat conduction member 40 overlaps the entire first component 26 as viewed in the downward direction. Furthermore, the heat conduction member 40 is in contact with the upper surface of the first component 26. The heat conduction member 40 is, for example, a metal plate made of copper or the like. Therefore, the thermal conductivity of the heat conduction member 40 is higher than the thermal conductivity of the upper circuit board body 12a.

The conductor members 35a to 35d are metal pins. The conductor members 35a to 35d have a rod shape extending along the up-down axis. As illustrated in FIG. 2, the conductor member 35a is disposed at the left front of the first component 26 as viewed in the downward direction. The conductor member 35b is disposed on the right front of the first component 26 as viewed in the downward direction. The conductor member 35c is disposed on the left back of the first component 26 as viewed in the downward direction. The conductor member 35d is disposed on the right back of the first component 26 as viewed in the downward direction.

The upper ends of the conductor members 35a to 35d are mounted on the heat conduction member 40. The lower end of the conductor member 35a is mounted on the back end of the first conductor layer 42a. The lower end of the conductor member 35b is mounted on the back end of the first conductor layer 42b. The lower end of the conductor member 35c is mounted on the front end of the first conductor layer 42c. The lower end of the conductor member 35d is mounted on the front end of the first conductor layer 42d. Due to this, the heat conduction member 40 is coupled to the first conductor layers 42a to 42d via a conductor.

The heat dissipation members 44a to 44d are metal members or conductive members. The heat dissipation members 44a to 44d re, for example, metal pins. As illustrated in FIG. 3, the heat dissipation members 44a to 44d have a rod shape extending along the up-down axis. The thickness of the heat dissipation members 44a to 44d in the up-down direction is larger than the thickness of the first conductor layers 42a to 42d in the up-down direction. The lower end of the heat dissipation member 44a is mounted on the front end of the first conductor layer 42a. The lower end of the heat dissipation member 44b is mounted on the front end of the first conductor layer 42b. The lower end of the heat dissipation member 44c is mounted on the back end of the first conductor layer 42c. The lower end of the heat dissipation member 44d is mounted on the back end of the first conductor layer 42d. Due to this, the heat dissipation members 44a to 44d are directly coupled to the first conductor layers 42a to 42d.

As illustrated in FIG. 1, the first sealing resin 18 is disposed between the first lower main surface S2 and the second upper main surface S11. The first sealing resin 18 covers the first lower main surface S2 and the second upper main surface S11. The first sealing resin 18 covers the plurality of components 24, the first component 26, the plurality of components 27, the plurality of conductor members 34, the plurality of conductor members 30, the conductor members 35a to 35d, the heat conduction member 40, the first conductor layers 42a to 42d, and the heat dissipation members 44a to 44d. As a result, the plurality of components 24, the first component 26, the plurality of components 27, the plurality of conductor members 34, the plurality of conductor members 30, the conductor members 35a to 35d, the heat conduction member 40, and the first conductor layers 42a to 42d are disposed in the first sealing resin 18.

However, the heat dissipation members 44a and 44b are exposed from the first sealing resin 18 on the front surface of the first sealing resin 18. The heat dissipation members 44c and 44d are exposed from the first sealing resin 18 on the back surface of the first sealing resin 18. Due to this, parts of the heat dissipation members 44a to 44d are exposed from the first sealing resin 18 in a direction orthogonal to the up-down axis. The first sealing resin 18 has a cuboid shape. As viewed in the downward direction, the entire outer edge of the first sealing resin 18 overlaps the entire outer edge of the upper circuit board 12 and the entire outer edge of the lower circuit board 14.

As illustrated in FIG. 1, the sealing resin 16 covers the first upper main surface S1. The sealing resin 16 covers the plurality of components 22. The sealing resin 16 has a cuboid shape. As viewed in the downward direction, the entire outer edge of the sealing resin 16 overlaps the entire outer edge of the upper circuit board 12 and the entire outer edge of the lower circuit board 14.

As illustrated in FIG. 1, the sealing resin 20 covers the second lower main surface S12. The sealing resin 20 covers the plurality of conductor members 32 and the plurality of components 28. However, the lower ends of the plurality of conductor members 32 and the lower surfaces of the plurality of components 28 are exposed from the sealing resin 20. The sealing resin 20 has a cuboid shape. As viewed in the downward direction, the entire outer edge of the sealing resin 20 overlaps the entire outer edge of the upper circuit board 12 and the entire outer edge of the lower circuit board 14. The materials of the first sealing resin 18, the sealing resin 16, and the sealing resin 20 as described above are, for example, epoxy resins.

Effects

According to the circuit module 10, heat generated by the first component 26 disposed between the upper circuit board 12 and the lower circuit board 14 can be released to the outside of the circuit module 10. More specifically, the heat conduction member 40 is disposed in a space between the first lower main surface S2 and the second upper main surface S11. Furthermore, the heat conduction member 40 overlaps the first component 26 as viewed in the downward direction. Due to this, the heat generated by the first component 26 is transferred to the heat conduction member 40. The heat conduction member 40 is coupled to the first conductor layers 42a to 42d via the conductor members 35a to 35d. The heat dissipation members 44a to 44d are directly coupled to the respective first conductor layers 42a to 42d. Due to this, the heat transferred to the heat conduction member 40 is transferred to the heat dissipation members 44a to 44d via the first conductor layers 42a to 42d. Here, parts of the heat dissipation members 44a to 44d are exposed from the first sealing resin 18 in the direction orthogonal to the up-down axis. Due to this, the heat transferred to the heat dissipation members 44a to 44d is released to the outside of the circuit module 10. In this case, for example, when the housing is close to the circuit module 10, heat is effectively released from the side surface of the housing. As described above, according to the circuit module 10, heat generated by the first component 26 disposed between the upper circuit board 12 and the lower circuit board 14 can be released to the outside of the circuit module 10.

The thickness of heat dissipation members 44a to 44d in the up-down direction is larger than the thickness of first conductor layers 42a to 42d in the up-down direction. That is, the heat dissipation members 44a to 44d are exposed from the first sealing resin 18 in a large area. Due to this, the heat transferred to the heat dissipation members 44a to 44d is more efficiently released to the outside of the circuit module 10.

In the circuit module 10, the heat conduction member 40 is in contact with the upper surface of the first component 26. Due to this, the heat generated by the first component 26 is efficiently transferred to the heat conduction member 40. As a result, the heat generated by the first component 26 disposed between the upper circuit board 12 and the lower circuit board 14 can be efficiently released to the outside of the circuit module 10.

First Modification

Figure 4:
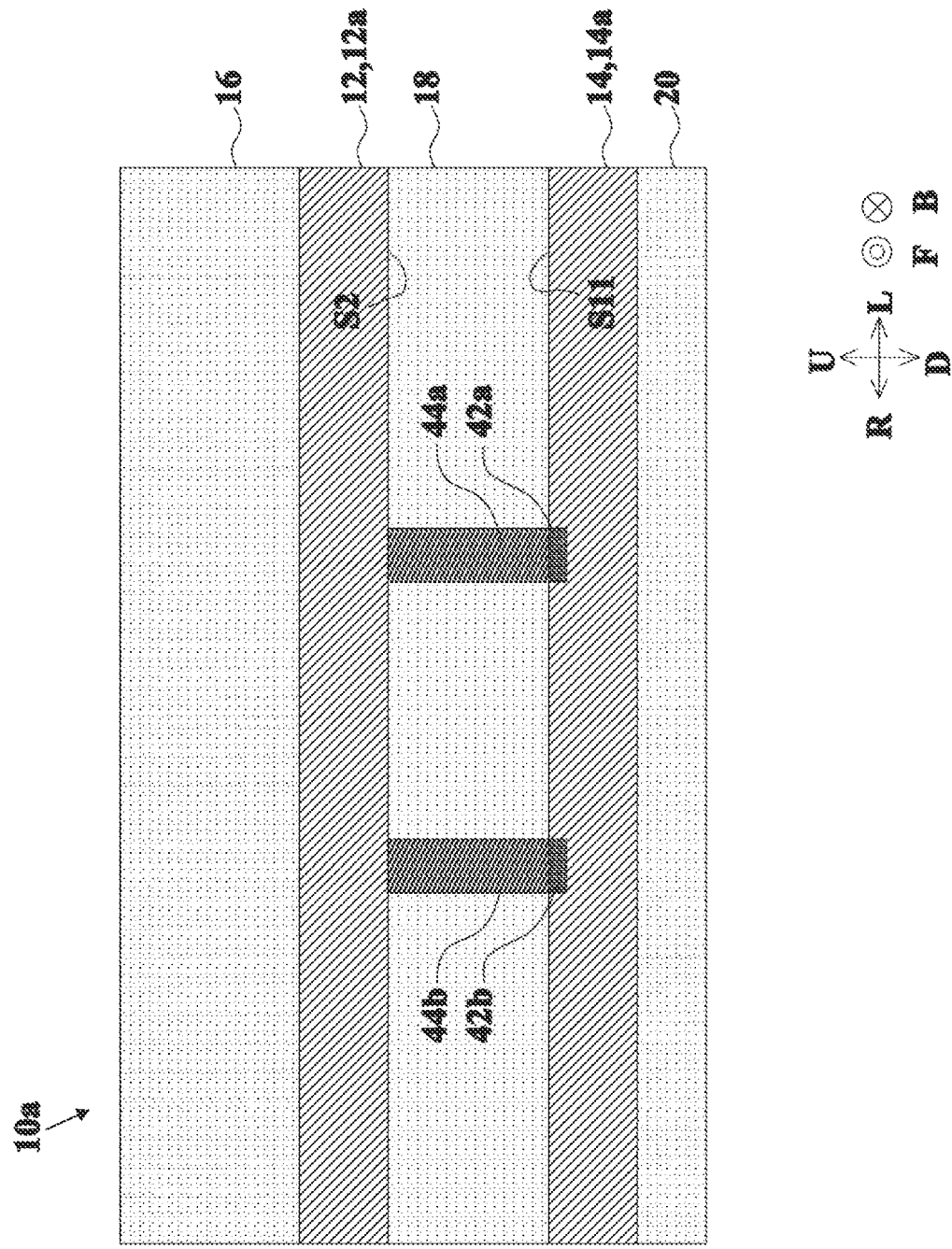

Hereinafter, the circuit module 10a according to a first modification will be described with reference to the drawings. FIG. 4 is a front view of a circuit module 10a.

The circuit module 10a is different from the circuit module 10 in the length in a direction along the up-down axis of the heat dissipation members 44a to 44d. More specifically, in the circuit module 10, the upper ends of the heat dissipation members 44a to 44d are not in contact with the first lower main surface S2. On the other hand, in the circuit module 10a, the upper ends of the heat dissipation members 44a to 44d are in contact with the first lower main surface S2. Therefore, the length of the heat dissipation members 44a to 44d in the up-down direction is equal to an interval between the upper circuit board 12 and the lower circuit board 14. Due to this, the area where the heat dissipation members 44a to 44d are exposed from the first sealing resin 18 is increased. As a result, the heat generated by the first component 26 disposed between the upper circuit board 12 and the lower circuit board 14 can be efficiently released to the outside of the circuit module 10a. The other structures of the circuit module 10a are the same as those of the circuit module 10, and thus description will be omitted. The circuit module 10a has the same functions and effects as those of the circuit module 10.

Second Modification

Figure 5:
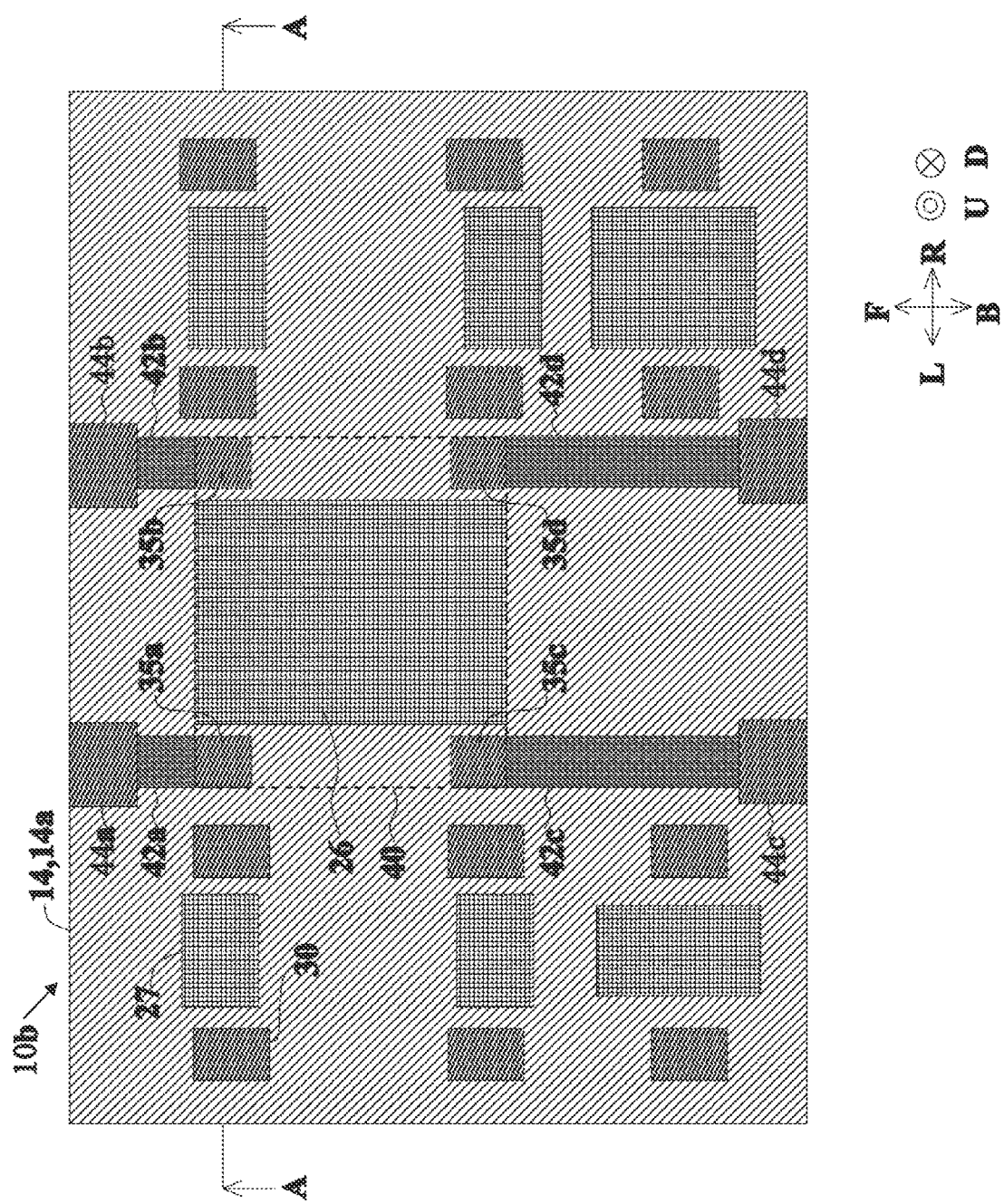
FIG. 5 is a top view of a circuit module 10b.

Hereinafter, the circuit module 10b according to a second modification will be described with reference to the drawings. FIG. 5 is a top view of a circuit module 10b.

The circuit module 10b is different from the circuit module 10 in the area of the heat dissipation members 44a to 44d as viewed in the downward direction. More specifically, the area of the heat dissipation members 44a to 44d as viewed in the downward direction is larger than the area of the conductor members 30, 34, and 35a to 35d as viewed in the downward direction. Due to this, the area where the heat dissipation members 44a to 44d are exposed from the first sealing resin 18 is increased. As a result, the heat generated by the first component 26 disposed between the upper circuit board 12 and the lower circuit board 14 can be efficiently released to the outside of the circuit module 10b. The other structures of the circuit module 10b are the same as those of the circuit module 10, and thus description will be omitted. The circuit module 10b has the same functions and effects as those of the circuit module 10.

Third Modification

Figure 6:
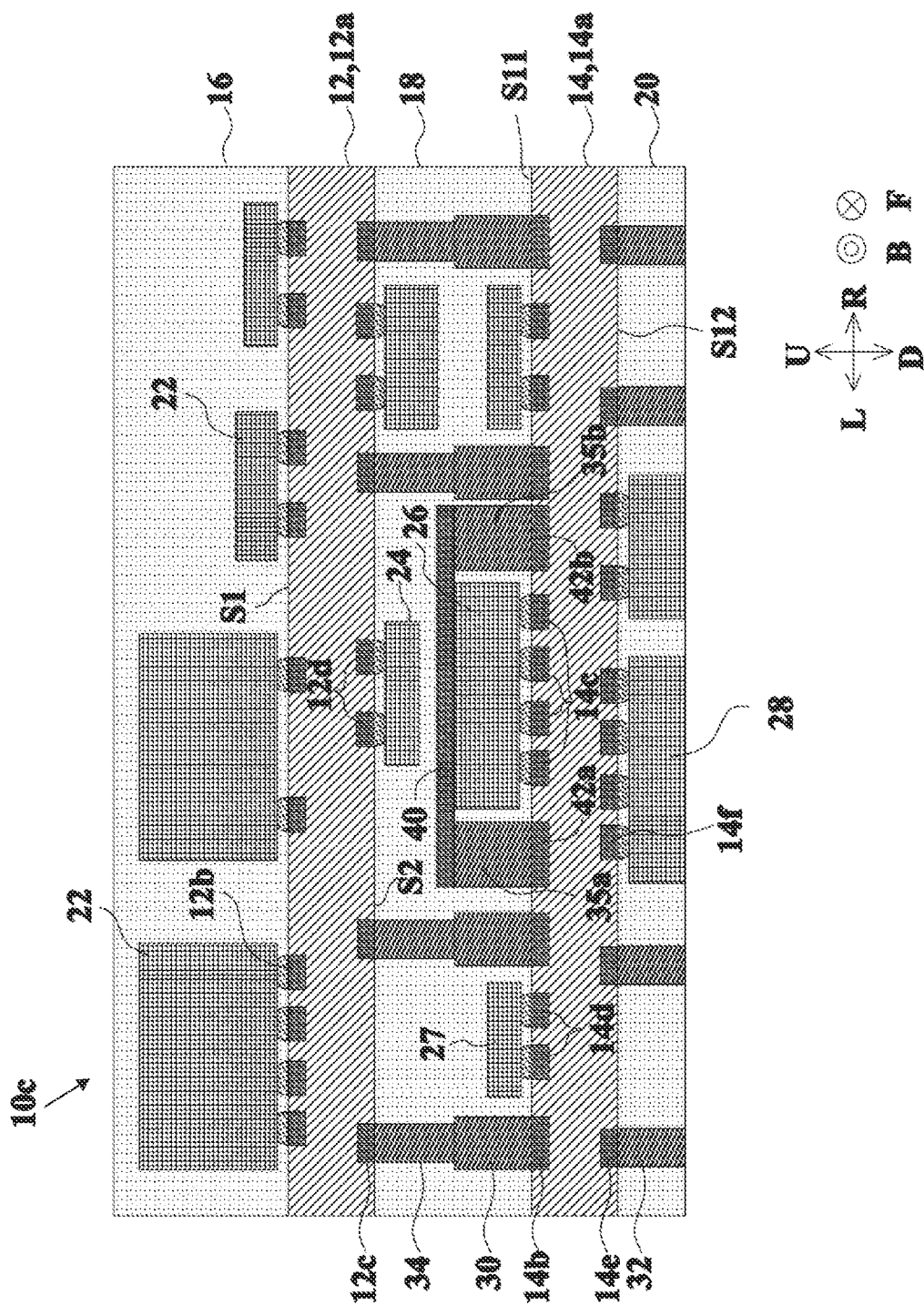
FIG. 6 is a cross-sectional view of a circuit module 10c.

Hereinafter, the circuit module 10c according to a third modification will be described with reference to the drawings. FIG. 6 is a cross-sectional view of a circuit module 10c.

The circuit module 10c is different from the circuit module 10 in the area of the conductor members 35a to 35d as viewed in the downward direction. More specifically, the area of the conductor members 35a to 35d as viewed in the downward direction is larger than the area of the plurality of conductor members 30 as viewed in the downward direction. Due to this, the heat generated by the first component 26 is efficiently transferred to the heat dissipation members 44a to 44d by the conductor members 35a to 35d. As a result, the heat generated by the first component 26 disposed between the upper circuit board 12 and the lower circuit board 14 can be efficiently released to the outside of the circuit module 10c. The other structures of the circuit module 10c are the same as those of the circuit module 10, and thus description will be omitted. The circuit module 10c has the same functions and effects as those of the circuit module 10.

Fourth Modification

Figure 7:
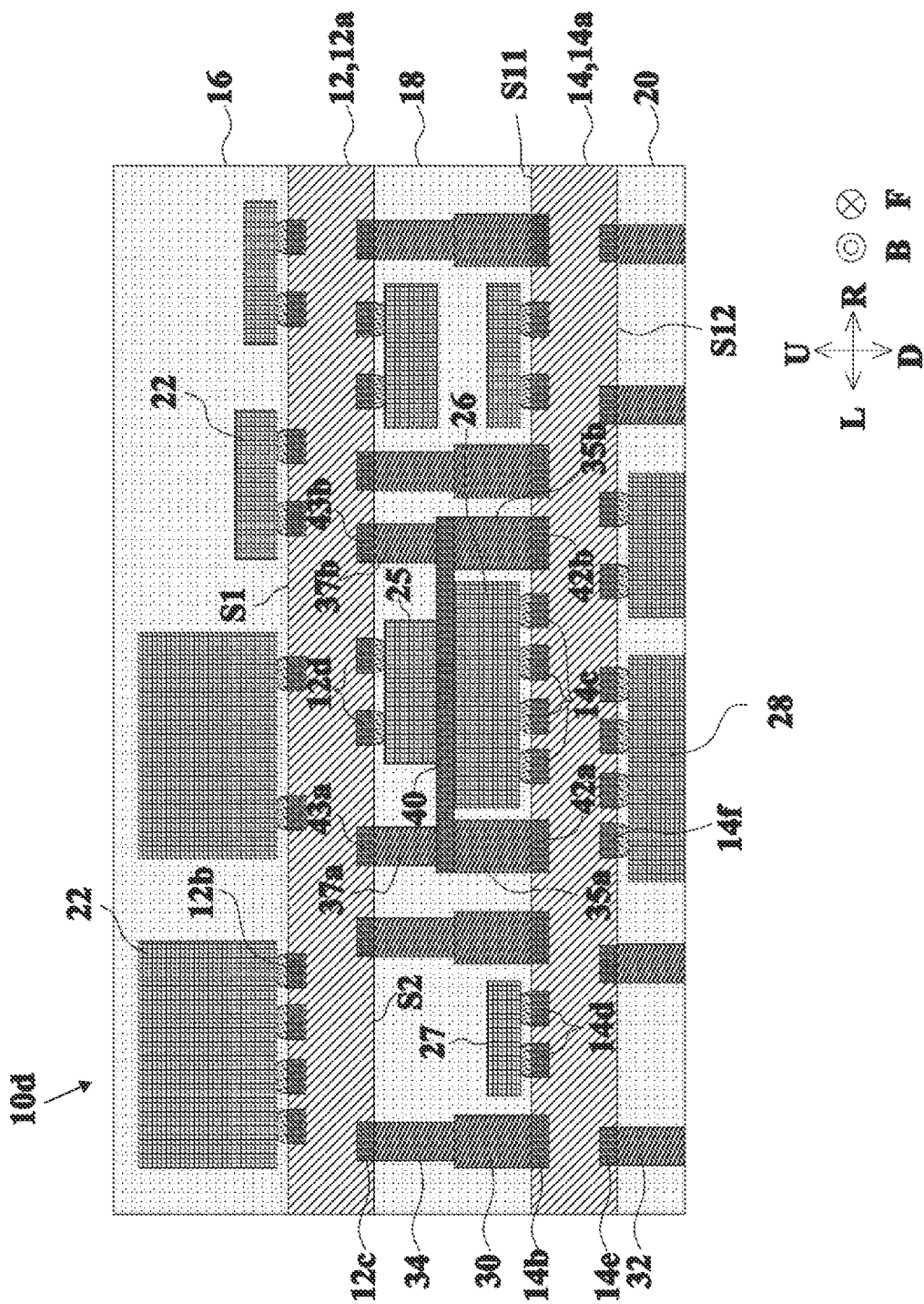
FIG. 7 is a cross-sectional view of a circuit module 10d.

Hereinafter, the circuit module 10d according to a fourth modification will be described with reference to the drawings. FIG. 7 is a cross-sectional view of a circuit module 10d.

The circuit module 10d is different from the circuit module 10 in the following point. The circuit module 10d further includes conductor members 37a to 37d (the conductor members 37c and 37d are not illustrated) and first conductor layers 43a to 43d (the first conductor layers 43c and 43d are not illustrated). The circuit module 10d includes a first component 25 instead of the component 24.

The first component 25 is mounted on the plurality of upper circuit board first mounting electrodes 12d. The first conductor layers 43a to 43d are disposed on the upper circuit board 12. The first conductor layers 43a to 43d are coupled to the respective heat dissipation members 44a to 44d not illustrated in FIG. 7.

The conductor members 37a to 37d are metal pins. The conductor members 37a to 37d extend along the up-down axis. The lower ends of the conductor members 37a to 37d are mounted on the heat conduction member 40. The upper end of the conductor member 37a is mounted on the back end of the first conductor layer 43a. The upper end of the conductor member 37b is mounted on the back end of the first conductor layer 43b. The upper end of the conductor member 37c is mounted on the front end of the first conductor layer 43c. The upper end of the conductor member 37d is mounted on the front end of the first conductor layer 43d.

Due to this, the heat generated by the first component 25 is released to the outside of the circuit module 10d via the heat conduction member 40, the conductor members 37a to 37d, and the heat dissipation members 44a to 44d. The other structures of the circuit module 10d are the same as those of the circuit module 10, and thus description will be omitted. The circuit module 10d has the same functions and effects as those of the circuit module 10.

(Fifth Modification)

Figure 8:
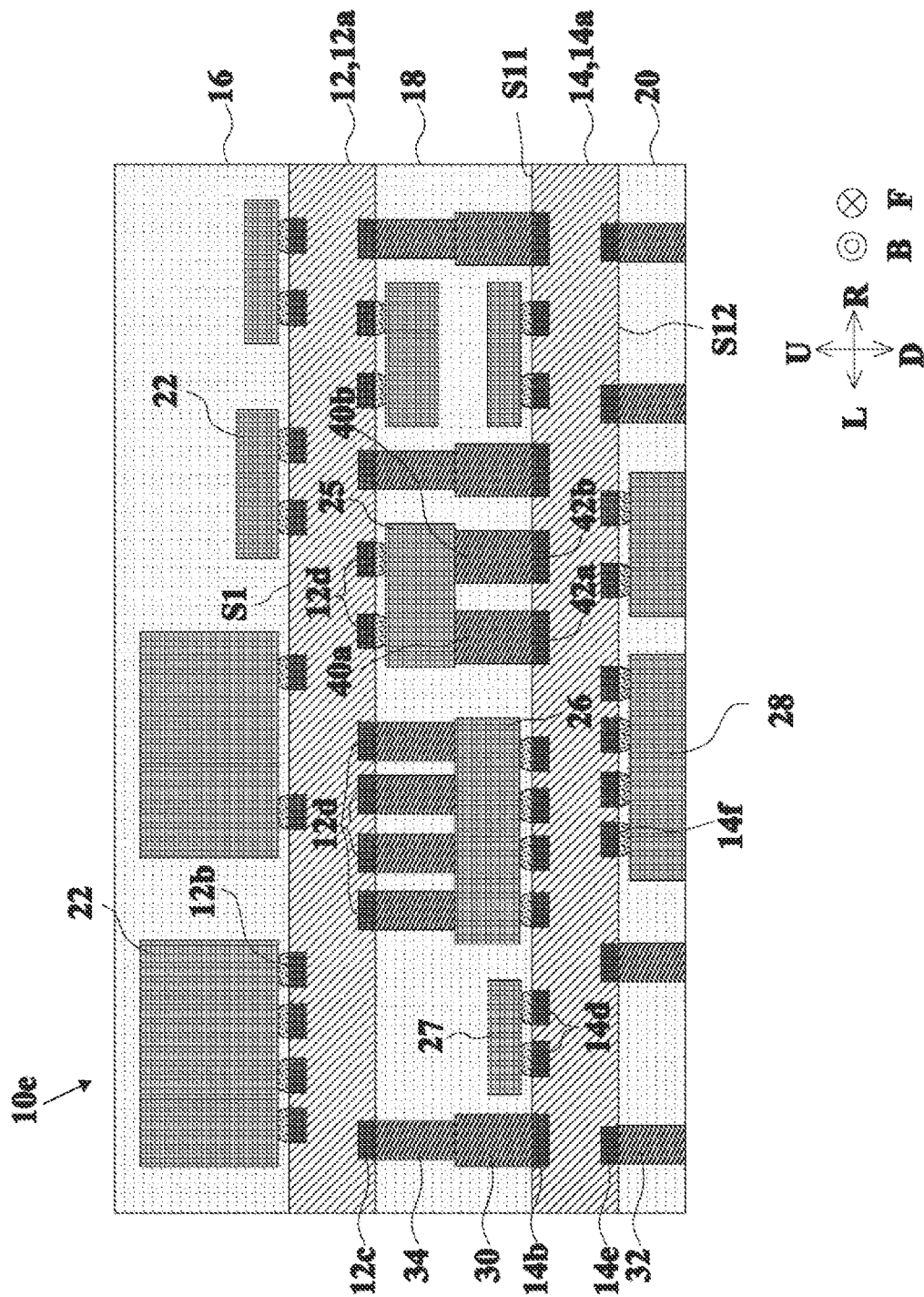
FIG. 8 is a cross-sectional view of a circuit module 10e.
Figure 9:
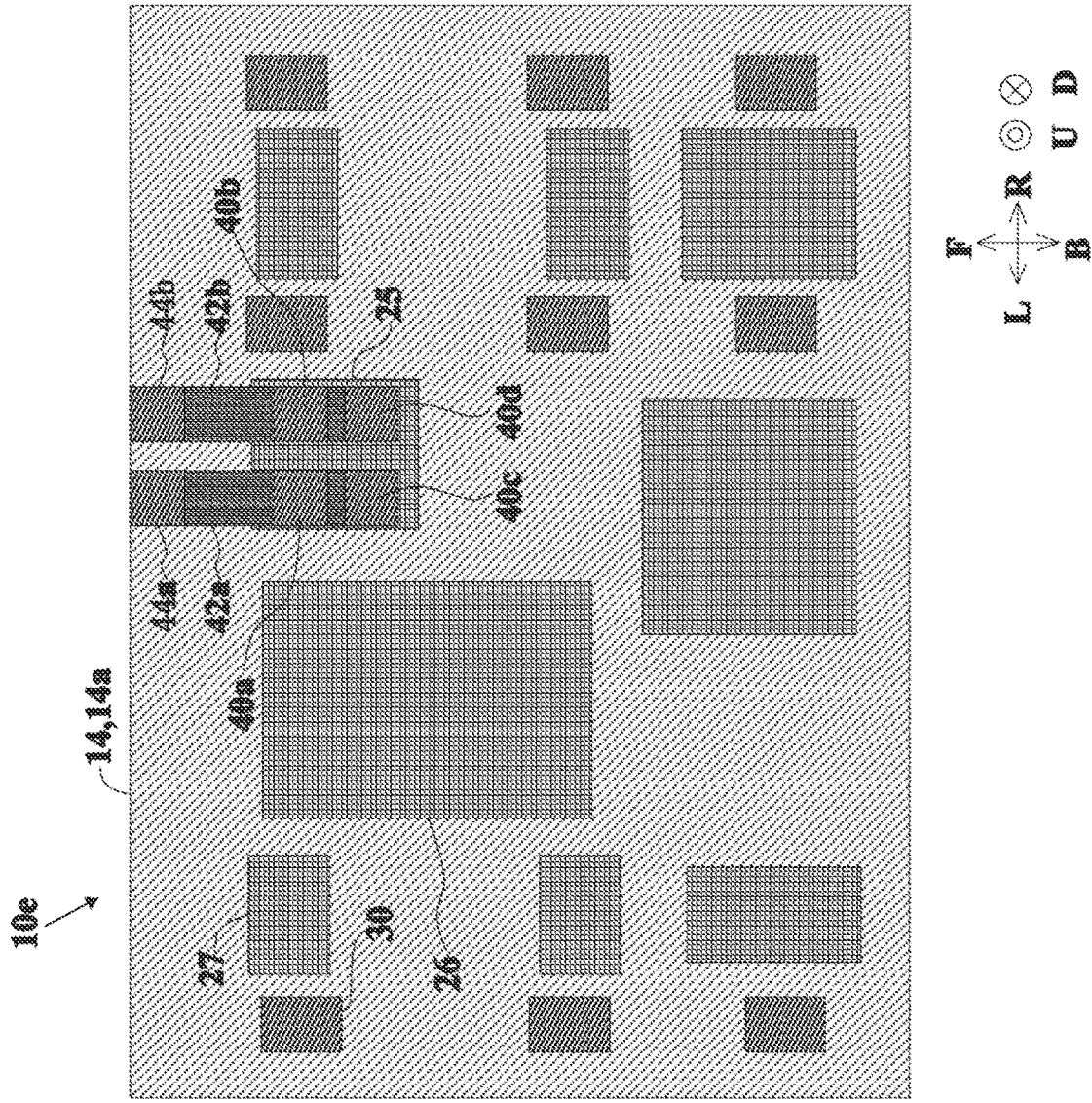
FIG. 9 is a top view of the circuit module 10e.

Hereinafter, the circuit module 10e according to a fifth modification will be described with reference to the drawings. FIG. 8 is a cross-sectional view of a circuit module 10e. FIG. 9 is a top view of the circuit module 10e.

The circuit module 10e is different from the circuit module 10d in including heat conduction members 40a to 40d instead of the heat conduction member 40. The heat conduction members 40a to 40d are metal pins extending along the up-down axis. The upper ends of the heat conduction members 40a to 40d are in contact with the lower surface of the first component 25. The lower end of the heat conduction member 40a is mounted on the back portion of the first conductor layer 42a. The lower end of the heat conduction member 40b is mounted on the back portion of the first conductor layer 42b. The lower end of the heat conduction member 40c is mounted on the back end of the first conductor layer 42a. The lower end of the heat conduction member 40d is mounted on the back end of the first conductor layer 42b. Due to this, the heat generated by the first component 25 is released to the outside of the circuit module 10e via the heat conduction members 40a to 40d, the first conductor layers 42a and 42b, and the heat dissipation members 44a and 44b. The other structures of the circuit module 10e are the same as those of the circuit module 10d, and thus description will be omitted. The circuit module 10e has the same functions and effects as those of the circuit module 10d.

Sixth Modification

Figure 10:
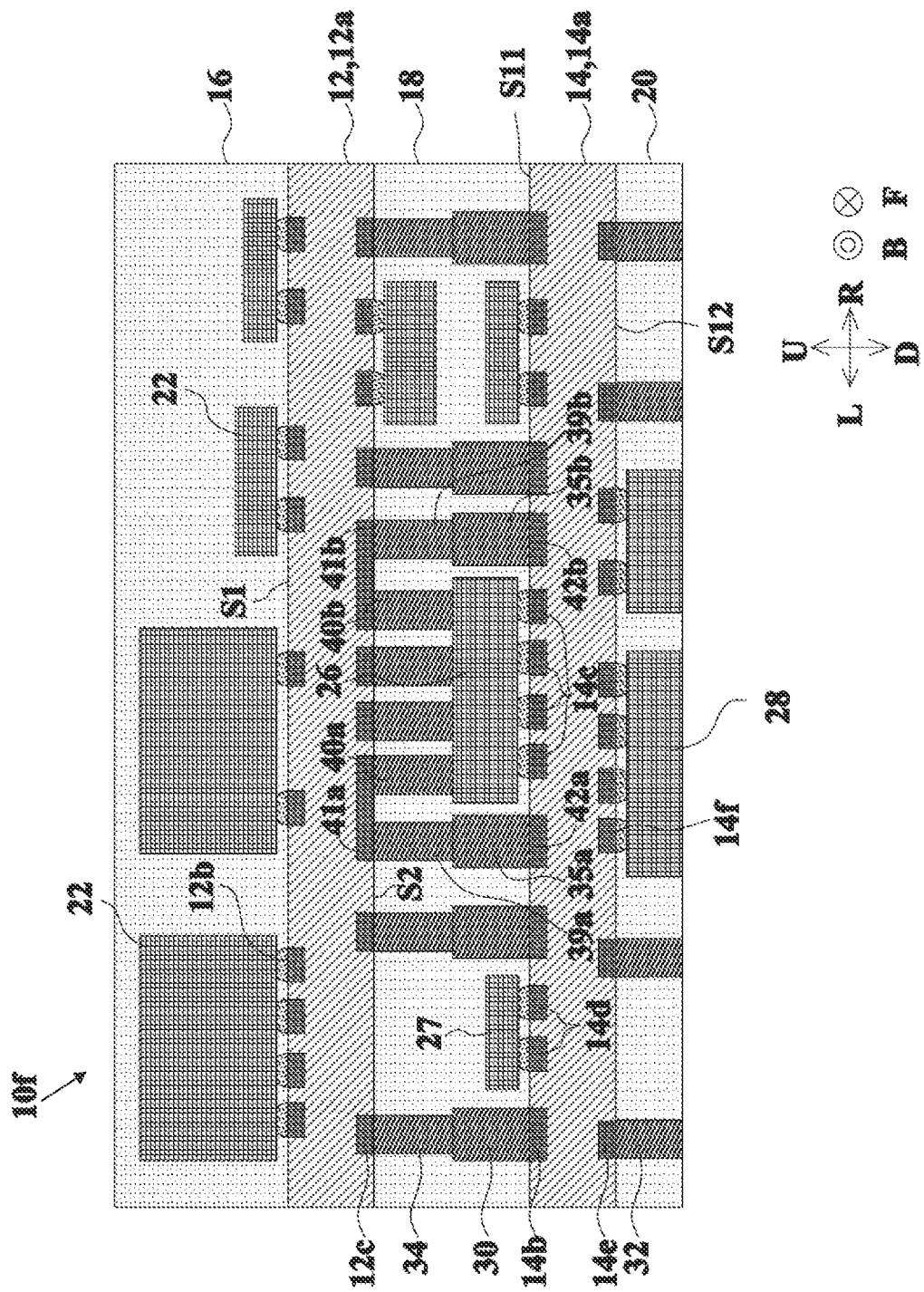
FIG. 10 is a cross-sectional view of a circuit module 10f.

Hereinafter, the circuit module 10f according to a sixth modification will be described with reference to the drawings. FIG. 10 is a cross-sectional view of a circuit module 10f. FIG. 11 is a top view of the circuit module 10f.

The circuit module 10f is different from the circuit module 10 in further including the heat conduction members 40a to 40d and 41a to 41d and conductor members 39a to 39d. More specifically, the heat conduction members 41a to 41d are disposed on the first lower main surface S2. The heat conduction members 41a to 41d extend in the left-right direction. The heat conduction members 41a to 41d are conductor layers.

The heat conduction members 40a to 40d are metal pins extending along the up-down axis. The lower ends of the heat conduction members 40a to 40d are in contact with the upper surface of the first component 26. The upper end of the heat conduction member 40a is mounted on the right end of the heat conduction member 41a. The upper end of the heat conduction member 40b is mounted on the left end of the heat conduction member 41b. The upper end of the heat conduction member 40c is mounted on the right end of the heat conduction member 41c. The upper end of the heat conduction member 40d is mounted on the left end of the heat conduction member 41d.

The heat conduction member 41a is coupled to the first conductor layer 42a via the conductor members 35a and 39a. The heat conduction member 41b is coupled to the first conductor layer 42b via the conductor members 35b and 39b. The heat conduction member 41c is coupled to the first conductor layer 42c via the conductor members 35c and 39c. The heat conduction member 41d is coupled to the first conductor layer 42d via the conductor members 35d and 39d. Due to this, the heat generated by the first component 26 is released to the outside of the circuit module 10f via the heat conduction members 40a to 40d and 41a to 41d, the conductor members 39a to 39d and 35a to 35d, the first conductor layers 42a to 42d, and the heat dissipation members 44a to 44d. The other structures of the circuit module 10f are the same as those of the circuit module 10, and thus description will be omitted. The circuit module 10f has the same functions and effects as those of the circuit module 10.

Seventh Modification

Figure 12:
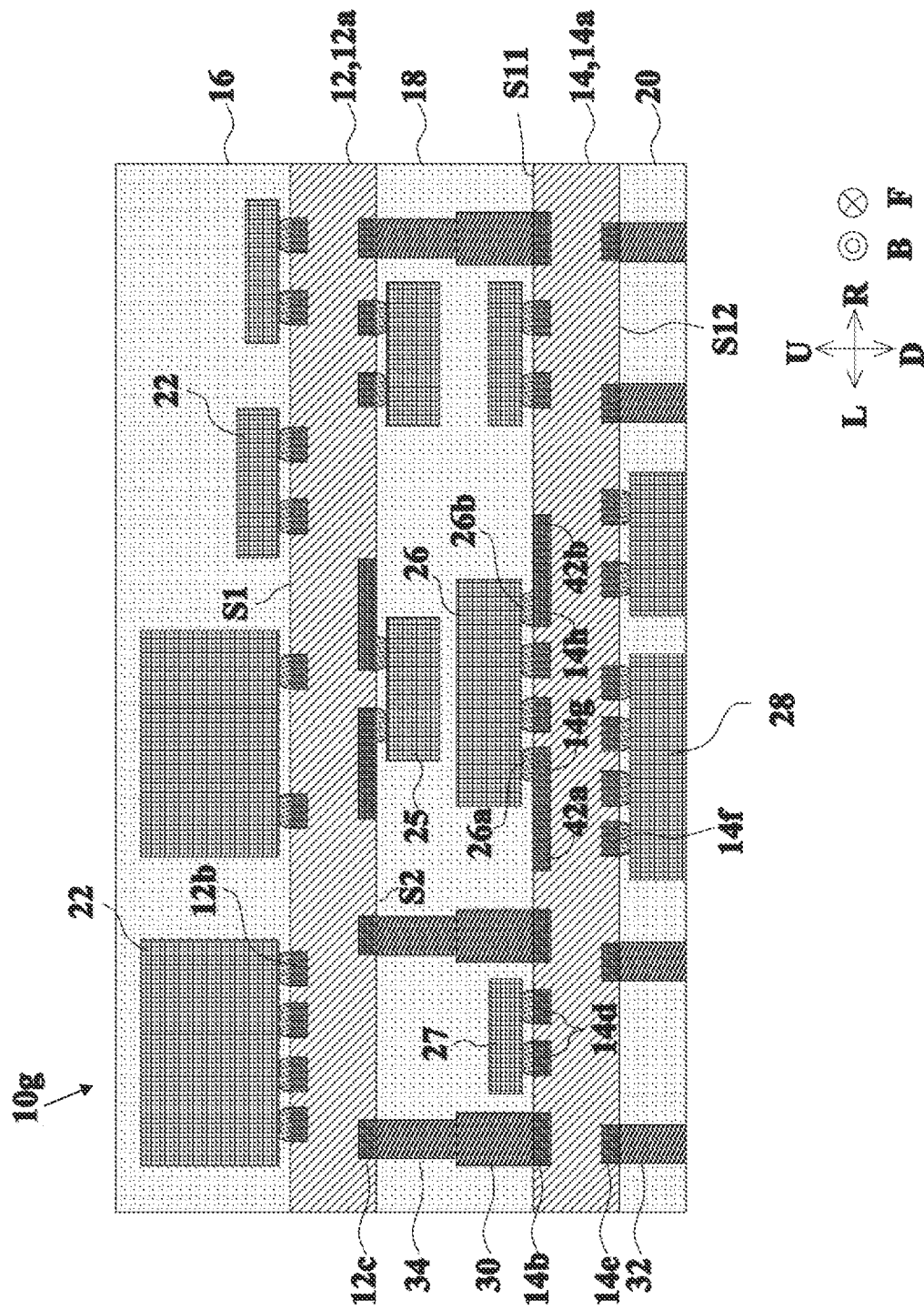
FIG. 12 is a cross-sectional view of a circuit module log.
Figure 14:
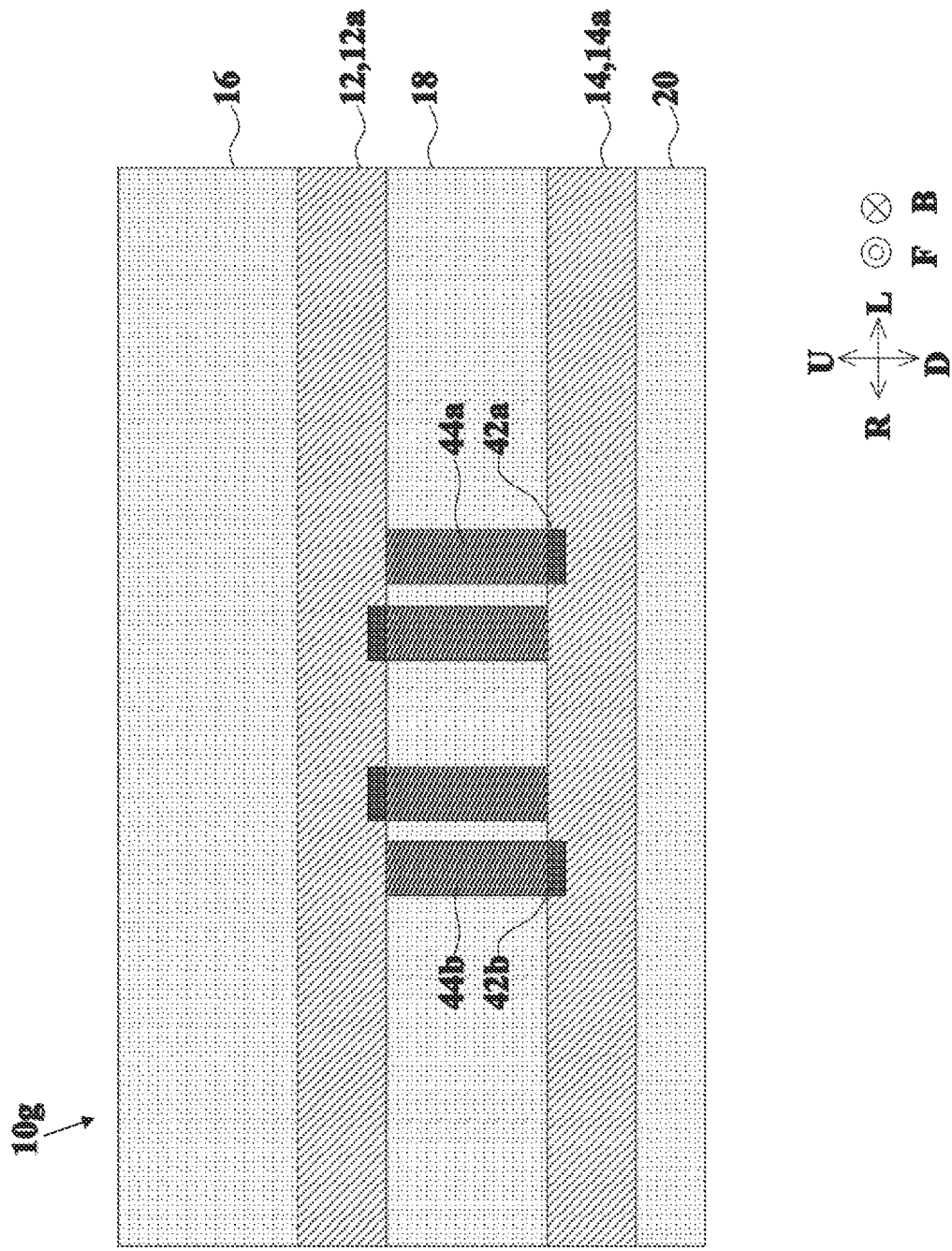
FIG. 14 is a front view of the circuit module 10g.

Hereinafter, the circuit module 10g according to a seventh modification will be described with reference to the drawings. FIG. 12 is a cross-sectional view of the circuit module 10g. FIG. 13 is a top view of the circuit module 10g. FIG. 14 is a front view of the circuit module 10g.

The circuit module 10g is different from the circuit module 10 in the following points. The first component 26 includes ground electrodes 26a to 26d. The lower circuit board 14 further includes ground mounting electrodes 14g to 14j.

The ground mounting electrodes 14g to 14j are disposed on the second upper main surface S11. The ground mounting electrodes 14g to 14j overlap the first component 26 as viewed in the downward direction. The ground electrodes 26a to 26d are mounted on the respective ground mounting electrodes 14g to 14j. Therefore, in the circuit module 10g, the heat conduction member is the ground mounting electrodes 14g to 14j disposed on the second upper main surface S11. The ground mounting electrodes 14g to 14j are directly coupled to the respective first conductor layers 42a to 42d. The other structures of the circuit module 10g are the same as those of the circuit module 10, and thus description will be omitted. The circuit module 10g has the same functions and effects as those of the circuit module 10.

Eighth Modification

Figure 15:
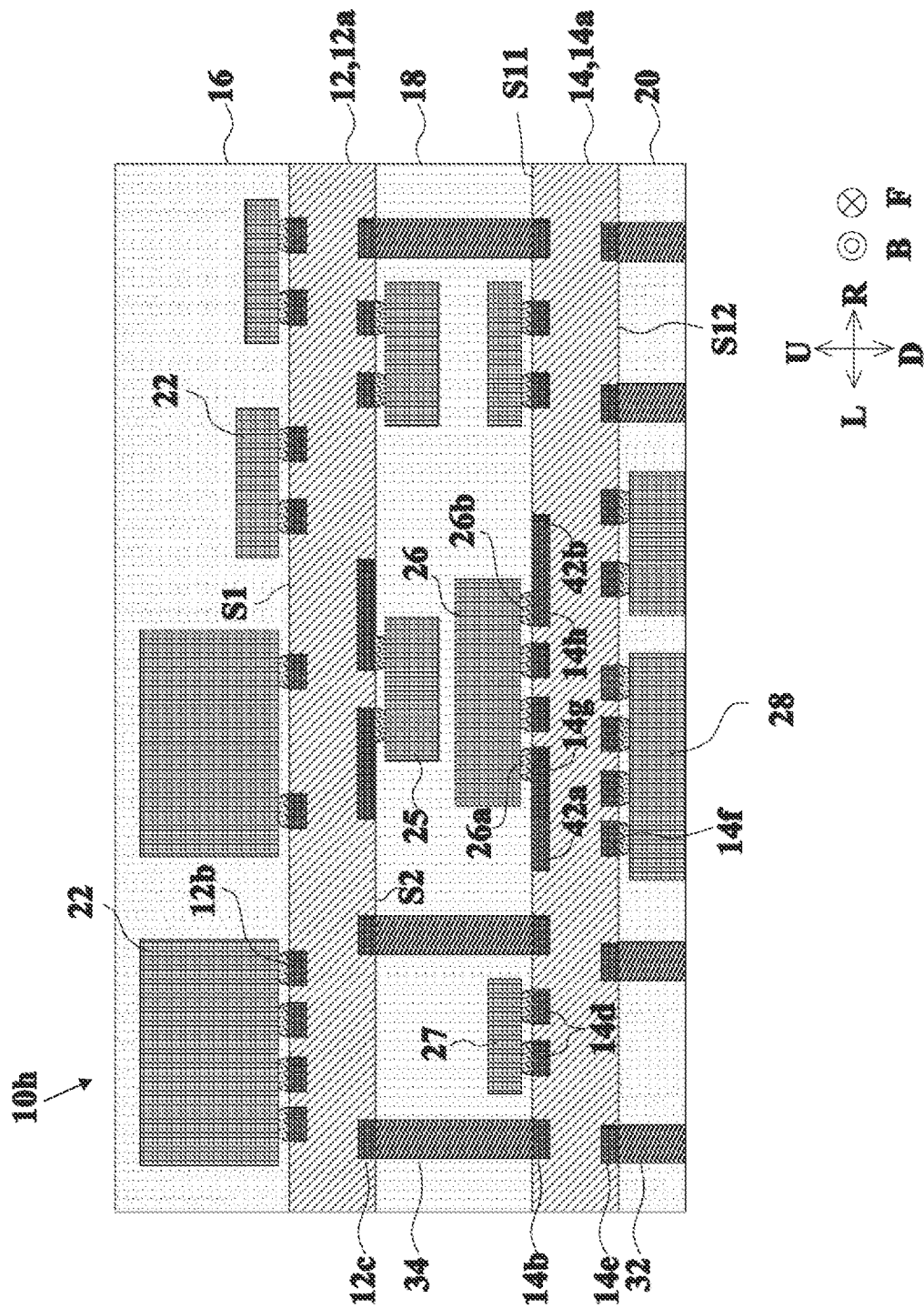
FIG. 15 is a cross-sectional view of a circuit module 10h.

Hereinafter, the circuit module 10h according to an eighth modification will be described with reference to the drawings. FIG. 15 is a cross-sectional view of a circuit module 10h.

The circuit module 10h is different from the circuit module 10g in not including the plurality of conductor members 30. The lower ends of the plurality of conductor members 34 are mounted on the plurality of lower circuit board mounting electrodes 14b. The other structures of the circuit module 10h are the same as those of the circuit module 10g, and thus description will be omitted. The circuit module 10h has the same functions and effects as those of the circuit module 10g.

Ninth Modification

Figure 16:
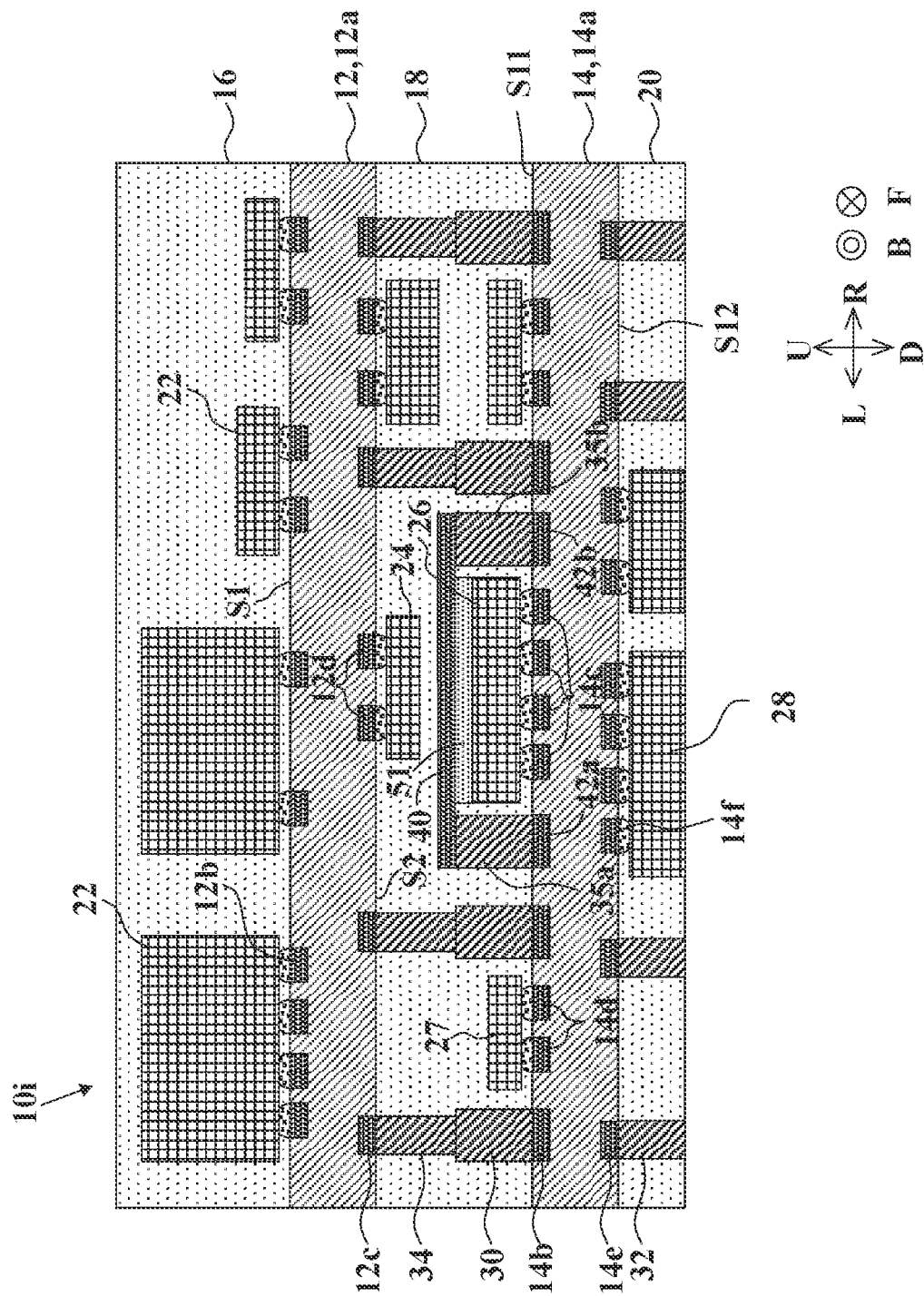
FIG. 16 is a cross-sectional view of a circuit module 10i.

Hereinafter, the circuit module 10i according to a ninth modification will be described with reference to the drawings. FIG. 16 is a cross-sectional view of the circuit module 10i.

The circuit module 10i is different from the circuit module 10 in further including a thermal interface material (TIM) layer 51. More specifically, the TIM layer 51 is disposed between the first component 26 and the heat conduction member 40. The lower surface of the TIM layer 51 is in contact with the upper surface of the first component 26. The upper surface of the TIM layer 51 is in contact with the lower surface of the heat conduction member 40.

The TIM layer 51 is a layer of a heat conduction material. That is, the TIM layer 51 is a layer of a material suitable for heat conduction. The material of the TIM layer 51 is non-conductive. The material of the TIM layer 51 may be, for example, an epoxy resin mixed with a metal. The metal to be mixed here may be, for example, gold, silver, or the like. The TIM layer 51 may be formed of thermal grease, white grease, or the like. The TIM layer 51 may be formed by combining two or more of thermal grease, white grease, and the like.

The material of the TIM layer 51 may be any of an epoxy resin, silicone, an inorganic material, and a matrix polymer. The material of the TIM layer 51 may be a polymer mixed with a heat conductive filler. The matrix polymer may contain any selected from the group consisting of ethylene propylene, a monomer of ethylene propylene diene, and hydrogenated polyisoprene, and may be a combination of two or more selected from this group. The TIM layer 51 may contain any selected from the group consisting of aluminum oxide, boron nitride, and aluminum nitride, and may be a combination of two or more selected from this group.

The TIM layer 51 may contain any selected from the group consisting of carbon nanotubes, graphite, graphene, a polyimide resin, polybenzoxazole, an epoxy-based polymer, a silica-based polymer, and an acryl-based polymer, and may be a combination of two or more selected from this group. The TIM layer 51 may contain a filler. The thermal conductivity of the material of the TIM layer 51 may be equal to or greater than 5 W/(m·K) and equal to or less than 100 W/(m·K). Furthermore, the thermal conductivity of the material of the TIM layer 51 is preferably equal to or greater than 10 W/(m·K) and equal to or less than 90 W/(m·K). Furthermore, the thermal conductivity of the material of the TIM layer 51 is preferably equal to or greater than 20 W/(m·K) and equal to or less than 80 W/(m·K). The material of the TIM layer 51 may have a structure in which a polymer is bonded to a liquid metal by an organometallic bond, a coordinate bond, or a covalent bond.

The heat generated by the first component 26 is efficiently transferred to the heat conduction member 40 by the TIM layer 51. As a result, the heat generated by the first component 26 disposed between the upper circuit board 12 and the lower circuit board 14 can be efficiently released to the outside of the circuit module 10i.

The other structures of the circuit module 10i are the same as those of the circuit module 10, and thus description will be omitted. The circuit module 10i has the same functions and effects as those of the circuit module 10.

Other Embodiments

The circuit module according to the present disclosure is not limited to the circuit modules 10 and 10a to 10i, and can be changed within the scope of the gist thereof. The structures of the circuit modules 10 and 10a to 10i may be arbitrarily combined.

The circuit modules 10 and 10a to 10i include the plurality of components 22. However, the circuit modules 10 and 10a to 10i only need to include one or more components 22.

The circuit modules 10 and 10a to 10i include the plurality of components 24. However, the circuit modules 10 and 10a to 10i only need to include one or more components 24.

The circuit modules 10 and 10a to 10i include the plurality of components 27. However, the circuit modules 10 and 10a to 10i only need to include one or more components 27.

The circuit modules 10 and 10a to 10i include the plurality of components 28. However, the circuit modules 10 and 10a to 10i only need to include one or more components 28.

The circuit modules 10 and 10a to 10i include the plurality of conductor members 34. However, the circuit modules 10 and 10a to 10i only need to include one or more conductor members 34.

The circuit modules 10 and 10a to 10i include the plurality of conductor members 30. However, the circuit modules 10 and 10a to 10i only need to include one or more conductor members 30.

The circuit modules 10 and 10a to 10i include the plurality of conductor members 32. However, the circuit modules 10 and 10a to 10i only need to include one or more conductor members 32.

A shield member covering the front surface, the back surface, the left surface, the right surface, and the upper surface of the circuit modules 10 and 10a to 10i may be provided.

The plurality of components 22, the plurality of components 24, the plurality of components 27, and the plurality of components 28 are not essential components.

The sealing resins 16 and 20 are not essential components.

The upper circuit board 12 only needs to include one or more upper circuit board first mounting electrodes.

The lower circuit board 14 only needs to include one or more lower circuit board first mounting electrodes.

The heat conduction member may be disposed on the second upper main surface S11.

The heat dissipation member may be coupled to the first conductor layer via a conductor.

The heat conduction member may be in contact with the first component lower surface.

The heat conduction member may be a ground mounting electrode disposed on the first lower main surface.

The first conductor layer may be disposed in the upper circuit board body or the lower circuit board body.

The plurality of conductor members 30 and 34 and the heat dissipation members 44a to 44d may be electrodes formed by plating. When the upper circuit board body 12a and the lower circuit board body 14a are LTCC boards, the plurality of conductor members 30 and 34 and the heat dissipation members 44a to 44d may be sintered metals.

The present disclosure includes the following structure.

(1) A circuit module including: an upper circuit board; a lower circuit board; a first component; a first sealing resin; a heat conduction member; a first conductor layer; and a heat dissipation member; in which the upper circuit board includes an upper circuit board body and one or more upper circuit board first mounting electrodes, the lower circuit board includes a lower circuit board body and one or more lower circuit board first mounting electrodes, and is disposed below the upper circuit board, the upper circuit board body has a first upper main surface and a first lower main surface, the lower circuit board body has a second upper main surface and a second lower main surface, the first sealing resin is disposed between the first lower main surface and the second upper main surface, the one or more upper circuit board first mounting electrodes are disposed on the first lower main surface, the one or more lower circuit board first mounting electrodes are disposed on the second upper main surface, the first component is mounted on the one or more upper circuit board first mounting electrodes or the one or more lower circuit board first mounting electrodes, and is disposed in the first sealing resin, the first conductor layer is disposed on the upper circuit board or the lower circuit board, the heat conduction member overlaps the first component as viewed in a downward direction of an up-down axis, is disposed on the first lower main surface, on the second upper main surface, or in a space between the first lower main surface and the second upper main surface, and is directly coupled to the first conductor layer or is coupled to the first conductor layer via a conductor, a part of the heat dissipation member is exposed from the first sealing resin in a direction orthogonal to an up-down axis, and the heat dissipation member is directly coupled to the first conductor layer or is coupled to the first conductor layer via a conductor.

(2) The circuit module according to (1), in which a thickness of the heat dissipation member in an up-down direction is larger than a thickness of the first conductor layer in the up-down direction, the up-down direction extending along the up-down axis.

(3) The circuit module according to (1) or (2), in which the heat conduction member is in contact with an upper surface or a lower surface of the first component.

(4) The circuit module according to (3), in which the heat conduction member is a metal pin extending along an up-down axis.

(5) The circuit module according to any of (1) to (3), in which the first component includes a ground electrode, the heat conduction member is a ground mounting electrode disposed on the first lower main surface or the second upper main surface, and the ground electrode is mounted on the ground mounting electrode.

(6) The circuit module according to any of (1) to (5), in which a length of the heat dissipation member in an up-down direction is equal to an interval between the upper circuit board and the lower circuit board, the up-down direction extending along the up-down axis.

(7) The circuit module according to any of (1) to (6) further including a conductor member, in which the conductor member electrically connects the upper circuit board and the lower circuit board, and an area of the heat dissipation member as viewed in a downward direction is larger than an area of the conductor member as viewed in a downward direction.

(8) The circuit module according to any of (1) to (7), in which the first conductor layer has a linear shape as viewed in a downward direction.

(9) The circuit module according to any of (1) to (4) and (6) to (8) further including a thermal interface material (TIM) layer, in which the TIM layer is disposed between the first component and the heat conduction member and is in contact with the first component and the heat conduction member.

What is claimed is:

1. A circuit module comprising:
an upper circuit board;
a lower circuit board;
a first component;
a first sealing resin;
a heat conduction member;
a first conductor layer; and
a heat dissipation member,
wherein
the upper circuit board includes an upper circuit board body and one or more upper circuit board first mounting electrodes,
the lower circuit board includes a lower circuit board body and one or more lower circuit board first mounting electrodes, and is disposed below the upper circuit board,
the upper circuit board body has a first upper main surface and a first lower main surface,
the lower circuit board body has a second upper main surface and a second lower main surface,
the first sealing resin is disposed between the first lower main surface and the second upper main surface,
the one or more upper circuit board first mounting electrodes are disposed on the first lower main surface,
the one or more lower circuit board first mounting electrodes are disposed on the second upper main surface,
the first component is mounted on the one or more upper circuit board first mounting electrodes or the one or more lower circuit board first mounting electrodes, and is disposed in the first sealing resin, the first conductor layer is disposed on the upper circuit board or the lower circuit board, the heat conduction member overlaps the first component as viewed in a downward direction of an up-down axis, is disposed on the first lower main surface, on the second upper main surface, or in a space between the first lower main surface and the second upper main surface, and is directly coupled to the first conductor layer or is coupled to the first conductor layer via a first conductor, a part of the heat dissipation member is exposed from the first sealing resin in a direction orthogonal to the up-down axis, and the heat dissipation member is directly coupled to the first conductor layer or is coupled to the first conductor layer via a second conductor.

2. The circuit module according to claim 1, wherein a thickness of the heat dissipation member in an up-down direction is more than a thickness of the first conductor layer in the up-down direction, the up-down direction extending along the up-down axis.

3. The circuit module according to claim 1, wherein the heat conduction member is in contact with an upper surface or a lower surface of the first component.

4. The circuit module according to claim 3, wherein the heat conduction member is a metal pin extending along the up-down axis.

5. The circuit module according to claim 1, wherein
the first component includes a ground electrode,
the heat conduction member is a ground mounting electrode disposed on the first lower main surface or the second upper main surface, and
the ground electrode is mounted on the ground mounting electrode.

6. The circuit module according to claim 1, wherein a length of the heat dissipation member in an up-down direction is equal to an interval between the upper circuit board and the lower circuit board, the up-down direction extending along the up-down axis.

7. The circuit module according to claim 1, further comprising a conductor member,
wherein
the conductor member electrically connects the upper circuit board and the lower circuit board, and
an area of the heat dissipation member as viewed in the downward direction is larger than an area of the conductor member as viewed in the downward direction.

8. The circuit module according to claim 1, wherein the first conductor layer has a linear shape as viewed in the downward direction.

9. The circuit module according to claim 1, further comprising a thermal interface material layer,
wherein the thermal interface material layer is disposed between the first component and the heat conduction member, and is in contact with the first component and the heat conduction member.

10. The circuit module according to claim 2, wherein the heat conduction member is in contact with an upper surface or a lower surface of the first component.

11. The circuit module according to claim 2, wherein
the first component includes a ground electrode,
the heat conduction member is a ground mounting electrode disposed on the first lower main surface or the second upper main surface, and
the ground electrode is mounted on the ground mounting electrode.

12. The circuit module according to claim 2, wherein a length of the heat dissipation member in the up-down direction is equal to an interval between the upper circuit board and the lower circuit board.

13. The circuit module according to claim 2, further comprising a conductor member,
wherein
the conductor member electrically connects the upper circuit board and the lower circuit board, and
an area of the heat dissipation member as viewed in the downward direction is larger than an area of the conductor member as viewed in the downward direction.

14. The circuit module according to claim 2, wherein the first conductor layer has a linear shape as viewed in the downward direction.

15. The circuit module according to claim 2, further comprising a thermal interface material layer,
wherein the thermal interface material layer is disposed between the first component and the heat conduction member, and is in contact with the first component and the heat conduction member.

* * * * *

UNITED STATES PATENT AND TRADEMARK OFFICE
CERTIFICATE OF CORRECTION

PATENT NO. : 12,414,225 B2
APPLICATION NO. : 18/483870
DATED : September 9, 2025
INVENTOR(S) : Yoshihito Otsubo Page 1 of 1

It is certified that error appears in the above-identified patent and that said Letters Patent is hereby corrected as shown below:

In the Specification

Column 2, Line 28, "circuit module log;" should be --circuit module 10g;--

Column 2, Line 29, "circuit module log;" should be --circuit module 10g;--

Signed and Sealed this
Eighteenth Day of November, 2025

John A. Squires
*Director of the United States Patent and Trademark Office*